US012677515B2

(12) United States Patent
Nien et al.

(10) Patent No.: US 12,677,515 B2
(45) Date of Patent: Jul. 7, 2026

(54) ELECTRONIC DEVICE

(71) Applicant: InnoLux Corporation, Miao-Li County (TW)

(72) Inventors: Chueh-Yuan Nien, Miao-Li County (TW); Chao-Chin Sung, Miao-Li County (TW); Chien-Tzu Chu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 382 days.

(21) Appl. No.: 18/333,086

(22) Filed: Jun. 12, 2023

(65) Prior Publication Data

US 2024/0021763 A1     Jan. 18, 2024

(30) Foreign Application Priority Data

Jul. 18, 2022     (CN) .......................... 202210842763.5

(51) Int. Cl.
H10H 20/856     (2025.01)
H10W 90/00     (2026.01)

(52) U.S. Cl.
CPC .......... H10H 20/856 (2025.01); H10W 90/00 (2026.01)

(58) Field of Classification Search
CPC . H10H 20/856; H01L 25/0753; H01L 25/167; H10W 90/00
See application file for complete search history.

(56) References Cited

U.S. PATENT DOCUMENTS 11,248,764 B2 *    2/2022    Park ......................... F21S 43/30
2024/0014359 A1 *    1/2024    Hsieh ................... H10H 20/854

FOREIGN PATENT DOCUMENTS

CN     103439833 A     12/2013
CN     105674207 A     6/2016
CN     113161332 A     7/2021

OTHER PUBLICATIONS

Ono et al., WO 2013/0150000, Jan. 31, 2013 (Year: 2013).*
Cao et al., WO 2022/242244, Nov. 24, 2022 (Year: 2022).*
Chinese language office action dated Jul. 28, 2023, issued in application No. TW 111135694.

* cited by examiner

*Primary Examiner* — Mary Ellen Bowman
(74) *Attorney, Agent, or Firm* — McClure, Qualey & Rodack, LLP

(57)     ABSTRACT

An electronic device is provided. The electronic device includes a driving substrate, a plurality of light-emitting units and a reflective structure. The plurality of light-emitting units are electrically connected to the driving substrate. The reflective structure is disposed adjacent to the plurality of light-emitting units. The reflective structure includes a first reflective element. The first reflective element has a first surface, and the first surface is adjacent to at least one of the plurality of light-emitting units. There is a first distance between an edge of the bottom of the first surface and an edge of the driving substrate. The first distance is greater than 0 mm and less than 10 mm.

19 Claims, 6 Drawing Sheets

ELECTRONIC DEVICE

CROSS REFERENCE TO RELATED APPLICATIONS

This application claims the benefit of China Application No. 202210842763.5, filed Jul. 18, 2022, the entirety of which is incorporated by reference herein.

BACKGROUND

Technical Field

The present disclosure is related to an electronic device, and in particular it is related to an electronic device including a reflective structure.

Description of the Related Art

Electronic products that are equipped with display panels, including tablet computers, notebook computers, smartphones, displays and televisions, have become an indispensable necessity in modern society. With the rapid development of these consumer electronics, consumers have high expectations regarding their quality, functionality, or price.

In some electronic devices, there are gaps between the driving substrate of the backlight module and the carrier. However, these gaps may reduce the edge brightness of the backlight module, thereby affecting the display quality of the electronic device. For example, this may reduce the uniformity of brightness.

In view of the foregoing, existing electronic devices still do not meet the high expectations placed upon them in all respects. The development of a structural design that can further improve the performance of electronic devices is still one of the current research topics in the industry.

SUMMARY

In accordance with some embodiments of the present disclosure, an electronic device is provided. The electronic device includes a driving substrate, a plurality of light-emitting units and a reflective structure. The plurality of light-emitting units are electrically connected to the driving substrate. The reflective structure is disposed adjacent to the plurality of light-emitting units. The reflective structure includes a first reflective element. The first reflective element has a first surface, and the first surface is adjacent to at least one of the plurality of light-emitting units. There is a first distance between an edge of the bottom of the first surface and an edge of the driving substrate, and the first distance is greater than 0 mm and less than 10 mm.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
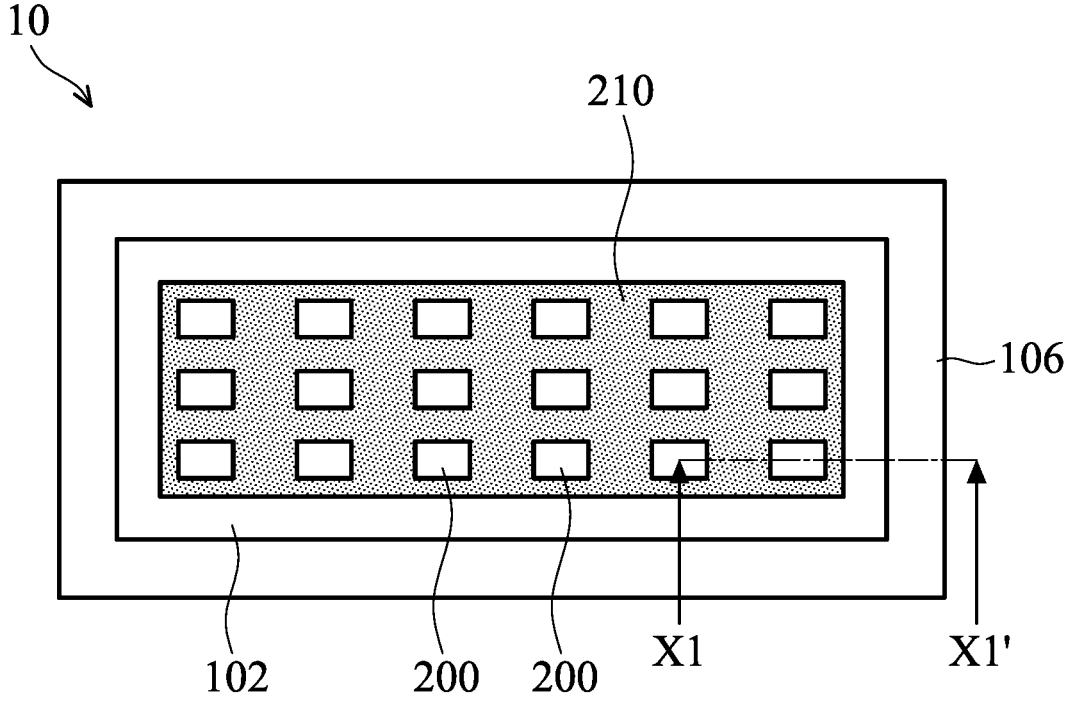
FIG. 1 is a top-view diagram of an electronic device in accordance with some embodiments of the present disclosure.

The electronic device according to the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the electronic device provided includes a reflective structure arranged in a specific configuration, which can improve the reflection efficiency of the reflective structure or improve the problem of low brightness in the peripheral area. The brightness uniformity of the electronic device therefore can be improved.

In accordance with the embodiments of the present disclosure, the electronic device may include a display device, a backlight device, an antenna device, a touch device, a sensing device, a vehicle device or a tiled device, but it is not limited thereto. The electronic device may be a bendable or flexible electronic device. The display device may be a non-self-luminous display device or a self-luminous display device. The antenna device may be a liquid-crystal type antenna device or a non-liquid-crystal type antenna device. The sensing device can be a sensing device for sensing capacitance, light, heat or ultrasonic, but it is not limited thereto. Furthermore, the electronic device may, for example, include liquid crystal, quantum dot (QD), fluorescence, phosphor, other suitable materials, or a combination thereof. The electronic device may include electronic components, and the electronic components may include passive components and active components, such as capacitors, resistors, inductors, diodes, transistors, and the like. The diodes may include light-emitting diodes or photodiodes. The light-emitting diodes may, for example, include organic light-emitting diodes (OLEDs), mini light-emitting diodes (mini LEDs), micro light-emitting diodes (micro LEDs) or quantum dot light-emitting diodes (QD LED), but it is not limited thereto. In accordance with some embodiments, the electronic device may include a panel and/or a backlight module, and the panel may include, for example, a liquid-crystal panel or other self-luminous panels, but it is not limited thereto. The tiled device may be, for example, a display tiled device or an antenna tiled device, but it is not limited thereto. It should be understood that the electronic device can be any permutation and combination of the foregoing, but it is not limited thereto. In the following description, a display device is used as an example of an electronic device to illustrate the content of the present disclosure, but the present disclosure is not limited thereto.

Figure 2:
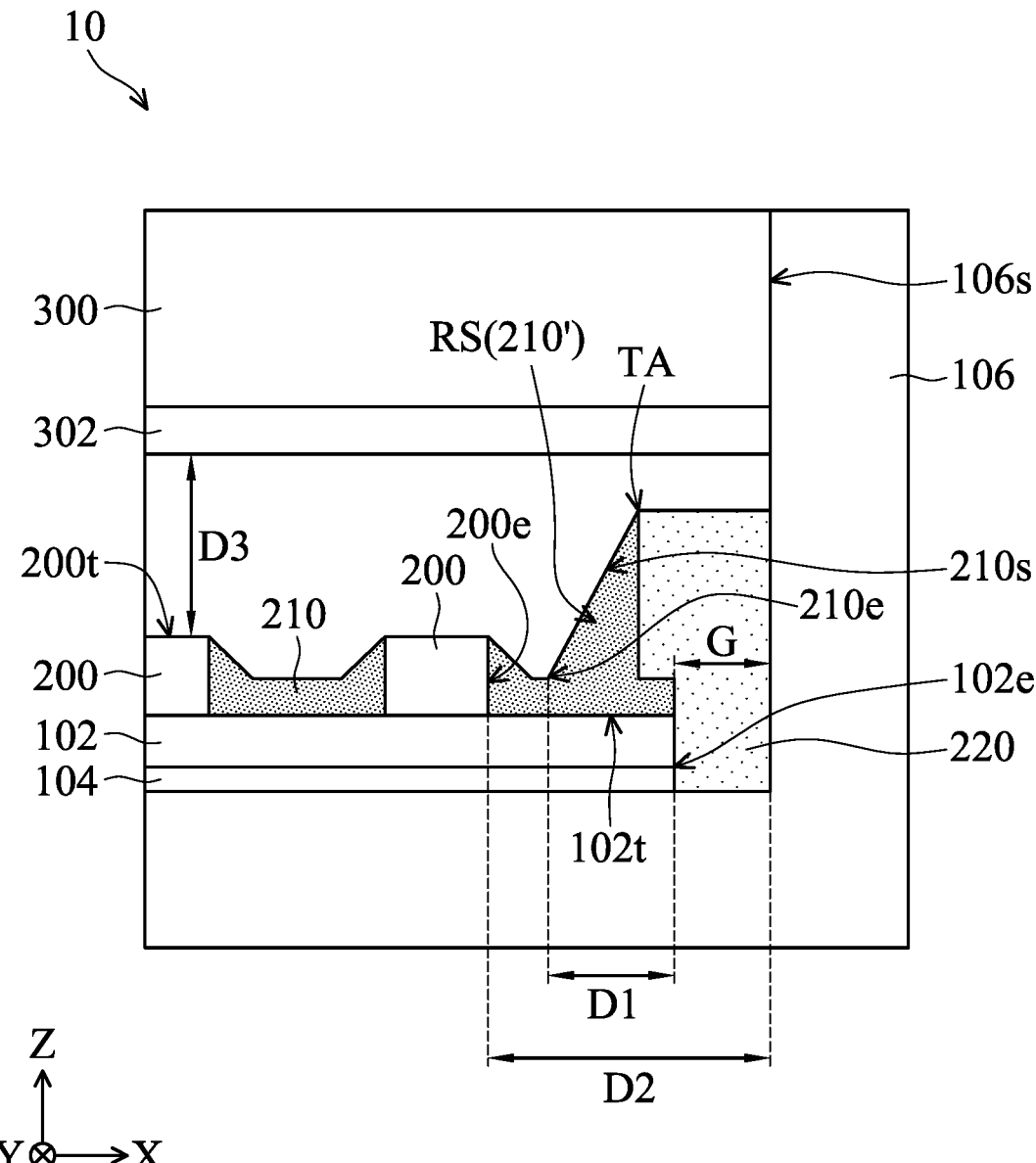
FIG. 2 is a partial cross-sectional diagram of an electronic device in accordance with some embodiments of the present disclosure.

Please refer to FIG. 1 and FIG. 2. FIG. 1 is a top-view diagram of an electronic device 10 in accordance with some embodiments of the present disclosure. FIG. 2 is a partial cross-sectional diagram of the electronic device 10 corresponding to the section line X-X' in FIG. 1 in accordance with some embodiments of the present disclosure. It should be understood that, for clarity, some elements of the electronic device 10 may be omitted in the drawings, and only some elements are schematically shown. For example, the display panel 300 and the optical film layer 302 are omitted in FIG. 1. Furthermore, in accordance with some embodiments, additional features may be added to the electronic device 10 described below.

The electronic device 10 may include a driving substrate 102, a plurality of light-emitting units 200 and a reflective structure RS. The light-emitting units 200 and the reflective structure RS may be disposed on the driving substrate 102. The reflective structure RS may be adjacent to the light-emitting units 200, and the light-emitting units 200 may be electrically connected with the driving substrate 102. The driving substrate 102 may be used to control the light-emitting units 200. Furthermore, the electronic device 10 may include an adhesive layer 104 and a carrier 106. The adhesive layer 104 may be disposed between the driving substrate 102 and the carrier 106 to fix the driving substrate 102 on the carrier 106.

In accordance with some embodiments, the driving substrate 102 may include a substrate and a driving circuit disposed on the substrate. The substrate may include a rigid substrate or a flexible substrate. In accordance with some embodiments, the material of the substrate may include glass, quartz, sapphire, polyimide (PI), polycarbonate (PC), polyethylene terephthalate (PET), polypropylene (PP), polydimethylsiloxane (PDMS), another suitable material or a combination thereof, but it is not limited thereto. In accordance with some embodiments, the substrate may include a flexible printed circuit (FPC). Furthermore, the driving circuit may include an active driving circuit and/or a passive driving circuit. In accordance with some embodiments, the driving circuit may include thin-film transistors (TFTs) (for example, switching transistors, driving transistors, reset transistors, or another type of thin-film transistors), data lines, scan lines, touch signal lines, conductive pads, dielectric layers, capacitors or other circuits, etc., but it is not limited thereto. In addition, the thin-film transistor may be a top gate thin-film transistor, a bottom gate thin-film transistor, or a dual gate (double gate) thin-film transistor. The thin-film transistor may include at least one semiconductor layer, and the semiconductor layer may include, amorphous silicon, low-temp polysilicon (LTPS), metal oxide, another suitable material or a combination thereof, but it is not limited thereto. The metal oxide may include indium gallium zinc oxide (IGZO), indium zinc oxide (IZO), indium gallium zinc tin oxide (IGZTO), and another suitable material, or a combination thereof, but it is not limited thereto.

In accordance with some embodiments, the light-emitting unit 200 may include an inorganic light-emitting diode (LED), such as a micro light-emitting diode (micro LED), or a mini light-emitting diode (mini LED), an organic light-emitting diode (OLED), electroluminescence, another suitable light-emitting element, or a combination thereof, but the present disclosure is not limited thereto.

As shown in FIG. 2, in accordance with some embodiments, the reflective structure RS may include a reflective element 210'. The reflective element 210' may be a part of a reflective layer 210. The reflective layer 210 may be disposed on the driving substrate 102 and may surround the light-emitting units 200. The reflective element 210' may be disposed adjacent to at least one of the light-emitting units 200. In accordance with some embodiments, the reflective element 210' may be disposed between an edge 102e of the driving substrate 102 and the light-emitting unit 200. Moreover, in accordance with some embodiments, there may be a gap G between a sidewall 106s of the carrier 106 and the driving substrate 102, and the reflective element 210' may be adjacent to the gap G.

In addition, the reflective element 210' may have a surface 210s, and the surface 210s may be adjacent to at least one of the light-emitting units 200. There may be a first distance D1 between an edge 210e of the bottom of the surface 210s and an edge 102e of the driving substrate 102. The first distance D1 may be greater than 0 mm and less than 10 mm (i.e. 0 mm<the first distance D1<10 mm), or the first distance D1 may be greater than 0 mm and less than or equal to 9 mm (i.e. 0 mm<the first distance D1<9 mm), for example, 1 mm, 2 mm, 3 mm, 4 mm, 5 mm, 6 mm, 7 mm, 8 mm or 9 mm.

In accordance with some embodiments, the surface 210s of the reflective element 210' refers to a surface of the reflective element 210' that is farther away from the edge 102e of the driving substrate 102. In addition, if the reflective element 210' has multiple surfaces on the side farther away from the light-emitting unit 200 or closer to the carrier 106 (as shown in FIG. 2), the surface 210s refers to a surface that is relatively farther away from the carrier 106. In accordance with some embodiments, the edge 102e of the driving substrate 102 refers to the edge of the driving substrate 102 in the direction of the short side (e.g., the Z direction in the drawing). Moreover, the first distance D1 refers to the distance between the edge 210e of the surface 210s and the edge 102e of the driving substrate 102 in a direction perpendicular to the normal direction of the driving substrate 102 (for example, the X direction in the drawing).

It should be noted that when the first distance D1 between the edge 210e of the bottom of the surface 210s and the edge 102e of the driving substrate 102 is greater than 0 mm and less than 10 mm, the reflective element 210' can be closer to the light-emitting unit 200 (or active region) to increase the reflection area or reflection efficiency of the reflective structure RS, thereby improving the problem of low brightness in the gap G region between the carrier 106 and the driving substrate 102.

It should be understood that, in accordance with the embodiments of the present disclosure, a scanning electron microscope (SEM), an optical microscope (OM), a film thickness profiler (α-step), an ellipsometer or another suitable method may be used to measure the spacing or distance between elements, or the width, thickness, or height of each element. Specifically, in accordance with some embodiments, a scanning electron microscope may be used to obtain a cross-sectional image including the elements to be measured, and the spacing or distance between elements, or the width, thickness, or height of each element in the image can be measured.

In addition, in accordance with some embodiments, in the normal direction of the driving substrate 102 (for example, the Z direction in the drawing), a top surface TA (or the apex) of the reflective element 210' may be higher than the top surface 200t of the light-emitting unit 200. With this configuration, the reflection efficiency of the reflective structure RS (reflective element 210') can be improved, and the brightness of the displayed image can be increased.

In accordance with some embodiments, the reflective layer 210 may have a concave and convex profile or an irregular profile, but it is not limited thereto. In accordance with some embodiments, the reflective layer 210 may include a material with high reflectivity. For example, at an optical wavelength of 550 nm, the reflective layer 210 may include a material with a reflectivity greater than 85%, but it is not limited thereto. In accordance with some embodiments, the material of the reflective layer 210 may include white glue, white ink, another suitable reflective material or a combination thereof, but it is not limited thereto. In accordance with some embodiments, the material of the reflective layer 210 in a liquid or semi-solid form may be coated on the driving substrate 102 through a coating process, and the material of the reflective layer 210 may be cured through a curing process to form the reflective layer 210.

The adhesive layer 104 may be any suitable adhesive agent. For example, in accordance with some embodiments, the adhesive layer 104 may include a light-curable adhesive material, a heat-curable adhesive material, a light-heat-curable adhesive material, another suitable material, or a combination thereof, but it is not limited thereto. For example, the adhesive layer 104 may include optical clear adhesive (OCA), optical clear resin (OCR), pressure sensitive adhesive (PSA), another suitable adhesive material or a combination thereof, but it is not limited thereto.

The carrier 106 may serve as a frame of the electronic device 10. In accordance with some embodiments, there may be a second distance D2 between the light-emitting unit 200 closest to the sidewall 106s of the carrier 106 and the sidewall 106s of the carrier 106, and the second distance D2 may be greater than or equal to 3 mm and less than or equal to mm (i.e. 3 mm<the second distance D2<10 mm), for example, 4 mm, 5 mm, 6 mm, 7 mm, 8 mm or 9 mm. The aforementioned sidewall 106s refers to the inner sidewall of the carrier 106. Furthermore, the second distance D2 refers to the minimum distance between the sidewall 106s and the edge 200e of the light-emitting unit 200 in a direction perpendicular to the normal direction of the driving substrate 102 (for example, the X direction in the drawing).

In accordance with some embodiments, the material of the carrier 106 may include metal, plastic, ceramics, another suitable material or a combination thereof, but it is not limited thereto.

Moreover, as shown in FIG. 2, in accordance with some embodiments, the electronic device 10 may further include an auxiliary element 220. The auxiliary element 220 may make the reflective surface of the reflective structure RS closer to the light-emitting unit 200 to improve reflection efficiency. The auxiliary element 220 may be disposed between the carrier 106 and the reflective element 210'. The auxiliary element 220 may be disposed in the gap G, and the auxiliary element 220 may be in contact with the reflective element 210'. In accordance with some embodiments, in the normal direction of the driving substrate 102 (for example, the Z direction in the drawing), the auxiliary element 220 may at least partially overlap the driving substrate 102. In accordance with some embodiments, in the normal direction of the driving substrate 102 (for example, the Z direction in the drawing), the auxiliary element 220 may at least partially overlap the reflective element 210'. In accordance with some embodiments, the top surface (not illustrated) of the auxiliary element 220 may be aligned with the top surface TA of the reflective element 210'.

In accordance with some embodiments, the material of the auxiliary component 220 may include plastic, rubber, silicone, another suitable elastic material or a combination thereof, but it is not limited thereto. In accordance with some embodiments, the auxiliary element 220 may be disposed on the carrier 106 first, and then the reflective layer 210 (reflective element 210') may be formed on the driving substrate 102, but the present disclosure is not limited thereto.

Please referring to FIG. 2, in accordance with some embodiments, the electronic device 10 may further include an optical film layer 302. The optical film layer 302 may be disposed above the light-emitting units 200 and the reflective layer 210, and the optical film layer 302 may be disposed adjacent to the carrier 106. In accordance with some embodiments, there may be a third distance D3 between the top surface 200t of the light-emitting unit 200 and the optical film layer 302, and the third distance D3 may be greater than or equal to 0 mm and less than or equal to 6 mm (i.e. 0 mm<the third distance D3<6 mm), for example, 1 mm, 2 mm, 3 mm, 4 mm or 5 mm. The third distance D3 refers to the minimum distance between the optical film layer 302 and the top surface 200t of the light-emitting unit 200 in the normal direction of the driving substrate 102 (for example, the Z direction in the drawing).

In accordance with some embodiments, the optical film layer 302 may include a reflective film, a diffusion film, a light intensity enhancement film, an inverted prism film, a dual light intensity enhancement film, another suitable optical film, or a combination thereof, but it is not limited thereto.

In addition, in accordance with some embodiments, the electronic device 10 may further include a display panel 300, the display panel 300 may be disposed above the optical film layer 302, and the display panel 300 may be disposed adjacent to the carrier 106. In accordance with some embodiments, the aforementioned components formed on the driving substrate 102 may serve as a backlight module of the display panel 300, and the display panel 300 may be disposed on the backlight module. In accordance with some embodiments, the display panel 300 may include a liquid-crystal display panel. For example, the display panel 300 may include two opposite substrates and a display medium layer disposed between the two substrates. In addition, the display panel 300 may further include a polarizer, an alignment layer, a light-shielding layer, a color filter layer, a spacer element, a driving element, another suitable element or a combination thereof, but it is not limited thereto.

Figure 3:
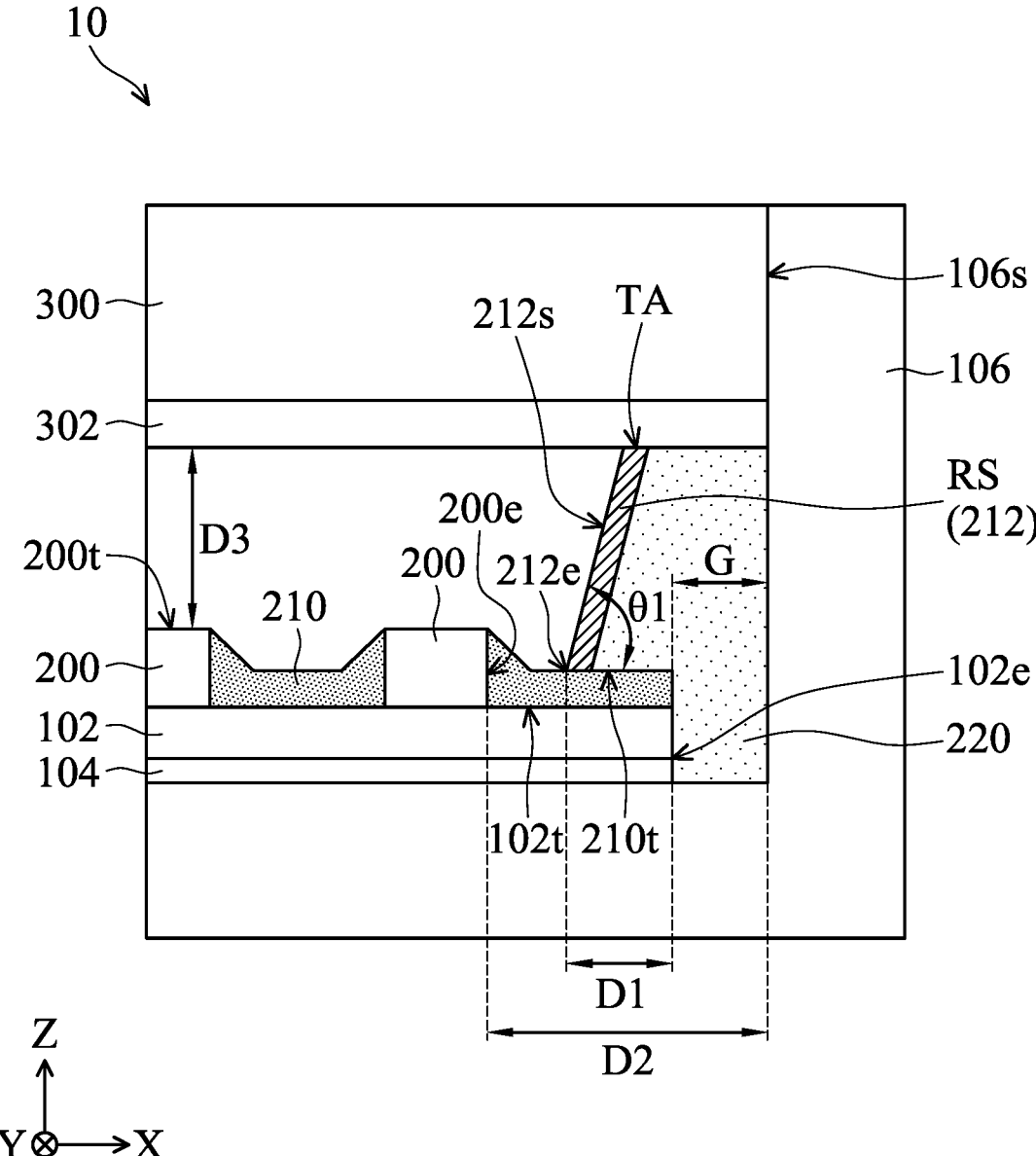
FIG. 3 is a partial cross-sectional diagram of an electronic device in accordance with some embodiments of the present disclosure.

Next, please refer to FIG. 3, which is a partial cross-sectional diagram of the electronic device 10 in accordance with some other embodiments of the present disclosure. It should be understood that the components or components that the same or similar components or elements in above and below contexts are represented by the same or similar reference numerals. The materials and functions of these components or elements are the same or similar to those described above, and thus will not be repeated herein.

As shown in FIG. 3, in this embodiment, the reflective structure RS may include a reflective element 212, and the reflective element 212 may be a structure independent of the reflective layer 210. The reflective element 212 may be disposed adjacent to at least one of the light-emitting units 200. The reflective element 212 may be disposed on the reflective layer 210 and adjacent to the auxiliary element 220. Specifically, the reflective element 212 may be disposed between the edge 102e of the driving substrate 102 and the light-emitting unit 200, and the reflective element 212 may be conformally disposed on the side surface of the auxiliary element 220 and in contact with the auxiliary element 220. For example, the auxiliary element 220 may have an inclined side surface. Moreover, the top surface TA of the reflective element 212 may be aligned with the top surface (not labeled) of the auxiliary element 220, and the top surface TA of the reflective element 212 and the top surface of the auxiliary element 220 may be in contact with the optical film layer 302. In the normal direction of the driving substrate 102 (for example, the Z direction in the drawing), the top surface TA (or the apex) of the reflective element 212 may also be higher than the top surface 200t of the light-emitting unit 200.

Similarly, in this embodiment, the reflective element 212 has a surface 212s, and the surface 212s is adjacent to at least one of the light-emitting units 200. There may be a first distance D1 between the edge 212e of the bottom of the surface 212s and the edge 102e of the driving substrate 102. The first distance D1 may be greater than 0 mm and less than mm (i.e. 0 mm<the first distance D1<10 mm), for example, 1 mm, 2 mm, 3 mm, 4 mm, mm, 6 mm, 7 mm, 8 mm or 9 mm.

Moreover, in this embodiment, there may be an angle θ1 between the surface 212s of the reflective structure RS (reflective element 212) and the top surface 210t of the reflective element 210. The angle θ1 may be greater than or equal to 25 degrees and less than or equal to 90 degrees (i.e. 25 degrees<angle θ1<90 degrees), for example, 30 degrees, 40 degrees, 50 degrees, 60 degrees, 70 degrees or 80 degrees. It should be noted that when the angle θ1 between the surface 212s and the top surface 210t of the reflective element 210 is between 25 degrees and 90 degrees, the reflective surface of the reflective element 212 can be closer to the light-emitting unit 200, and thereby improving the reflection efficiency of the reflective structure RS.

In this embodiment, the reflective element 212 may include a reflective sheet, and the reflective sheet may be a film with high reflectivity. For example, the reflectivity of the reflective sheet may be greater than 85%, but it is not limited thereto. The reflective sheet may include a base layer and a high-reflectivity coating formed on the base layer. In accordance with some embodiments, the material of the base layer of the reflective sheet may include polycarbonate (PC), polyethylene terephthalate (PET), polypropylene (PP), another suitable material, or a combination thereof, but it is not limited thereto. In accordance with some embodiments, the material of the high-reflectivity coating of the reflective sheet may include white coating, metal coating, another suitable material or a combination thereof, but it is not limited thereto. In accordance with some embodiments, the reflective sheet may be fixed on the auxiliary component 220 by an adhesive material.

Figure 4:
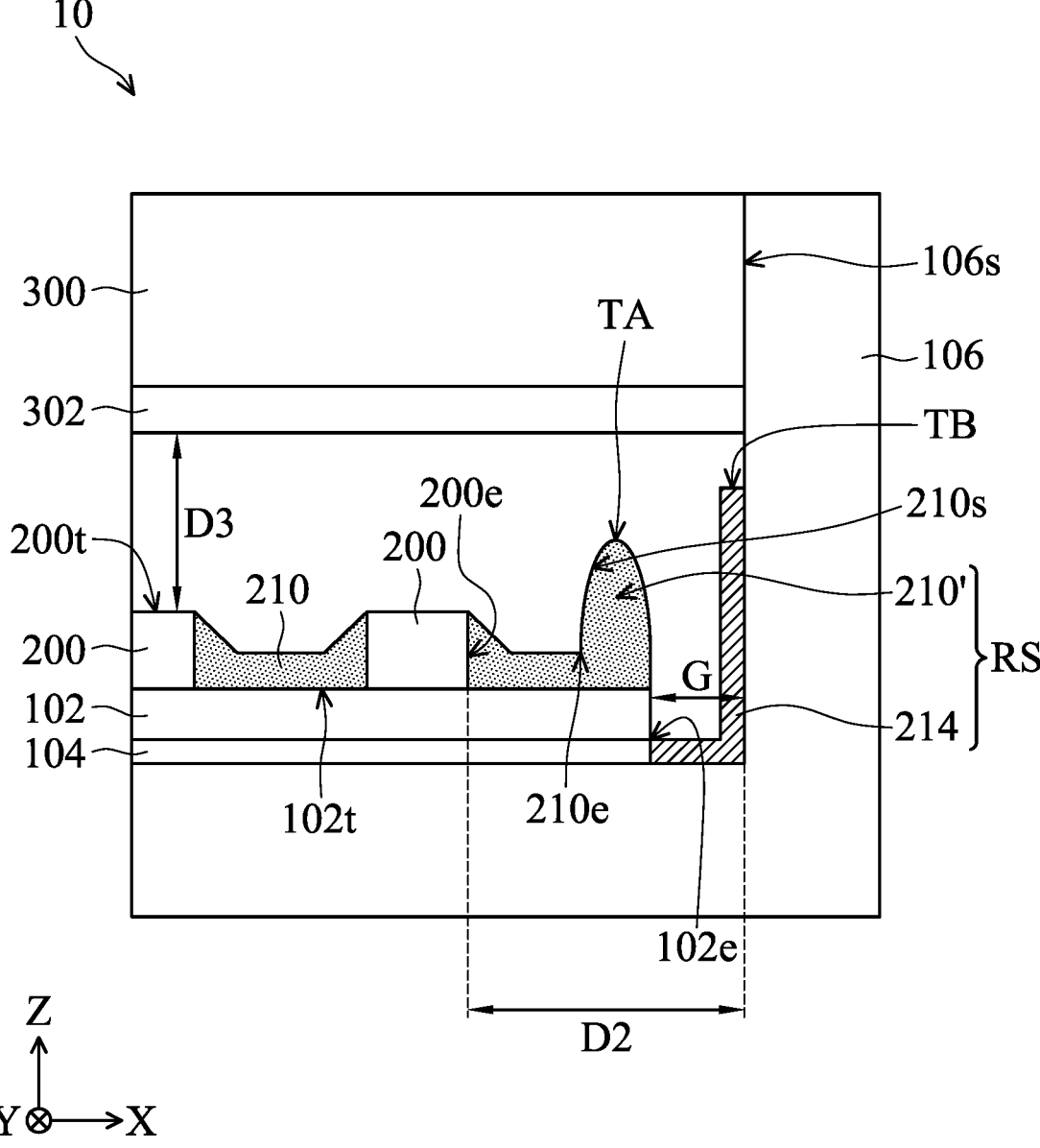
FIG. 4 is a partial cross-sectional diagram of an electronic device in accordance with some embodiments of the present disclosure.

Next, please refer to FIG. 4, which is a partial cross-sectional diagram of the electronic device 10 in accordance with some other embodiments of the present disclosure. As shown in FIG. 4, in this embodiment, the reflective structure RS may include a reflective element 210', and the reflective element 210' may be a part of the reflective layer 210. In addition, the reflective structure RS may further include a reflective element 214, and the reflective element 214 may be disposed in the gap G. A portion of the reflective element 214 may be disposed on the sidewall 106s of the carrier 106, and another portion may be disposed on the bottom surface of the carrier 106. In this embodiment, the electronic device 10 may not have the auxiliary element 220, and the reflective element 210' may have a rounded or curved profile. For example, the reflective element 210' may have a rounded top profile.

Moreover, in this embodiment, in the normal direction of the driving substrate 102 (for example, the Z direction in the drawing), a top surface TB of the reflective element 214 may be higher than the top surface TA of the reflective element 210'. With the configuration of the reflective element 214, the reflective effect of the reflective element 210' can be enhanced to reduce the occurrence of light leakage, thereby improving the reflection efficiency of the reflective structure RS, or improving the problem of low brightness of the gap G between the carrier 106 and the driving substrate 102.

In this embodiment, the reflective element 214 may include a reflective sheet, and the reflective sheet may be a film with high reflectivity. For example, at an optical wavelength of 550 nm, the reflectivity of the reflective sheet may be greater than 85%, but it is not limited thereto. The material of the reflective element 214 may be the same as or similar to that of the reflective element 212, and thus will not be repeated here.

Figure 5:
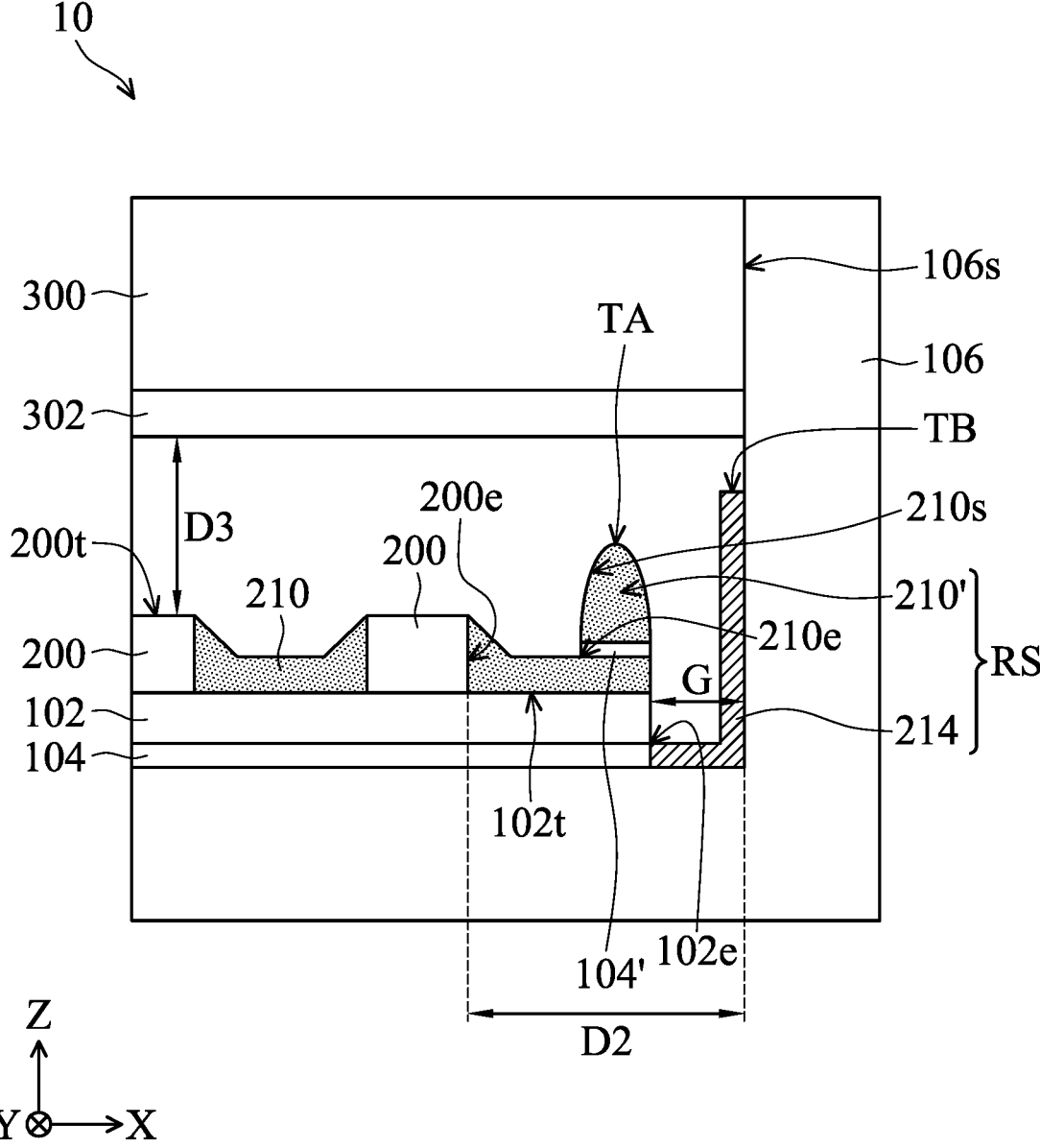
FIG. 5 is a partial cross-sectional diagram of an electronic device in accordance with some embodiments of the present disclosure.

Next, please refer to FIG. 5, which is a partial cross-sectional diagram of the electronic device 10 in accordance with some other embodiments of the present disclosure. As shown in FIG. 5, in this embodiment, the reflective structure RS may include a reflective element 210' and a reflective element 214. The reflective structure RS may include a high-reflectivity gasket as the reflective element 210', and the high-reflectivity gasket may be fixed on the reflective layer 210 through an adhesive layer 104'. The reflective element 214 may be disposed in the gap G, and a portion of the reflective element 214 may be disposed on the sidewall 106 s of the carrier 106.

The high-reflectivity gasket may be a structure independent of the reflective layer 210, and its height and profile can be easily adjusted in the manufacturing process. The high-reflectivity gasket may have a rounded or curved profile. For example, the high-reflectivity gasket may have a rounded top profile. Similarly, in the normal direction of the driving substrate 102 (for example, the Z direction in the drawing), the top surface TB of the reflective element 214 may be higher than the top surface TA of the high-reflectivity gasket (reflective element 210'). The material of the high-reflectivity gasket may be the same as or similar to that of the reflective layer 210, and thus will not be repeated here.

Figure 6:
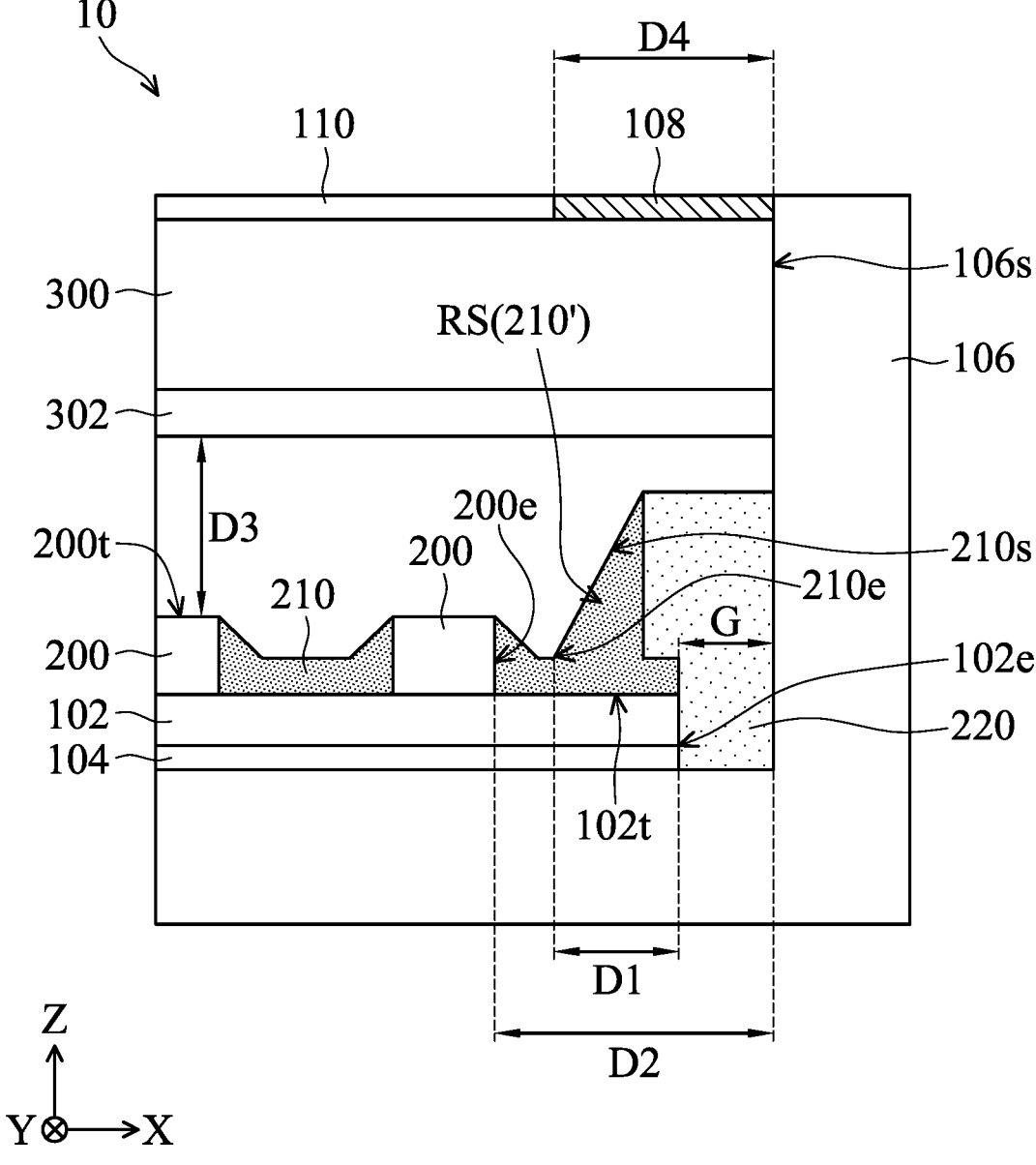
FIG. 6 is a partial cross-sectional diagram of an electronic device in accordance with some embodiments of the present disclosure.

Next, please refer to FIG. 6, which is a partial cross-sectional diagram of the electronic device 10 in accordance with some other embodiments of the present disclosure. As shown in FIG. 6, in this embodiment, the electronic device 10 may further include a frame 108 and a cover plate 110. The frame 108 and the cover plate 110 may be disposed on the display panel 300, and the frame 108 may be adjacent to the carrier 106. In the normal direction of the driving substrate 102 (for example, the Z direction in the drawing), the frame 108 may at least partially overlap the gap G and the reflective structure RS.

In this embodiment, there may be a fourth distance D4 between the inner edge of the frame 108 and the side wall 106s of the carrier 106, and the fourth distance D4 may be greater than or equal to 2 mm and less than or equal to 40 mm (i.e. 2 mm<fourth distance D4<40 mm), or may be greater than or equal to 5 mm and less than or equal to 35 mm, for example, 10 mm, 15 mm, 20 mm, 25 mm or 30 mm. The fourth distance D4 refers to the minimum distance between the inner edge of the frame 108 and the sidewall 106s of the carrier 106 in a direction perpendicular to the normal direction of the driving substrate 102 (for example, the X direction in the drawing).

In accordance with some embodiments, the frame 108 may include a light-shielding material, such as black photoresist, black printing ink, black resin, metal, carbon black material, resin material, photosensitive material, another suitable material, or a combination thereof, but it is not limited thereto.

Furthermore, the cover plate 110 may include a flexible substrate, a rigid substrate or a combination thereof, but it is not limited thereto. In accordance with some embodiments, the material of the cover plate 110 may include glass, quartz, sapphire, ceramics, polyimide (PI), polycarbonate (PC), polyethylene terephthalate (PET), polypropylene (PP), another suitable material or a combination thereof, but it is not limited thereto.

To summarize the above, in accordance with the embodiments of the present disclosure, the electronic device includes a reflective structure arranged in a specific configuration, which can improve the reflection efficiency of the reflective structure or improve the problem of low brightness in the peripheral area. The brightness uniformity of the electronic device therefore can be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:

a driving substrate;

a plurality of light-emitting units electrically connected to the driving substrate;

a reflective structure disposed adjacent to the plurality of light-emitting units; and a carrier comprising a first portion disposed below the driving substrate and a second portion perpendicular to the first portion and extending beyond the reflective structure, wherein there is a gap between an inner sidewall of the second portion of the carrier and the driving substrate, wherein the reflective structure comprises a first reflective element, and the first reflective element has a first surface adjacent to at least one of the plurality of light-emitting units;

wherein there is a first distance between an edge of the bottom of the first surface and an edge of the driving substrate, and the first distance is greater than 0 mm and less than 10 mm.

2. The electronic device as claimed in claim 1, wherein there is an angle between the first surface and a top surface of the reflective structure, and the angle is greater than or equal to 25 degrees and less than or equal to 90 degrees.

3. The electronic device as claimed in claim 1, wherein the first reflective element is disposed between the edge of the driving substrate and the plurality of light-emitting units.

4. The electronic device as claimed in claim 3, wherein the first reflective element comprises a high-reflectivity gasket.

5. The electronic device as claimed in claim 1, wherein the reflective structure further comprises a second reflective element, the second reflective element is disposed in the gap, and a top surface of the second reflective element is higher than a top surface of the first reflective element.

6. The electronic device as claimed in claim 5, wherein the second reflective element comprises a reflective sheet.

7. The electronic device as claimed in claim 1, wherein there is a second distance between one of the plurality of light-emitting units closest to the inner sidewall of the second portion of the carrier and the inner sidewall of the second portion of the carrier, and the second distance is greater than or equal to 3 mm and less than or equal to 10 mm.

8. The electronic device as claimed in claim 1, further comprising an auxiliary element disposed in the gap in contact with the first reflective element.

9. The electronic device as claimed in claim 1, further comprising a third reflective element, wherein a portion of the third reflective element is disposed on the inner sidewall of the second portion of the carrier, and another portion of the third reflective element is disposed on a bottom surface of the carrier.

10. The electronic device as claimed in claim 1, further comprising a frame disposed adjacent to the carrier, wherein the frame at least partially overlaps the gap and the reflective structure.

11. The electronic device as claimed in claim 1, wherein in a normal direction of the driving substrate, a top surface of the first reflective element is higher than a top surface of at least one of the plurality of light-emitting units.

12. The electronic device as claimed in claim 1, further comprising an optical film layer, wherein there is a third distance between a top surface of at least one of the plurality of light-emitting units and the optical film layer, and the third distance is greater than or equal to 0 mm and less than or equal to 6 mm.

13. The electronic device as claimed in claim 12, further comprising a display panel disposed above the optical film layer.

14. The electronic device as claimed in claim 1, further comprising an auxiliary element, wherein the auxiliary element at least partially overlaps the driving substrate in a normal direction of the driving substrate.

15. The electronic device as claimed in claim 14, wherein a top surface of the auxiliary element is aligned with a top surface of the first reflective element.

16. The electronic device as claimed in claim 1, wherein the first reflective element is disposed on the driving substrate and surrounds the plurality of light-emitting units.

17. The electronic device as claimed in claim 1, wherein the first reflective element has a concave and convex profile or an irregular profile.

18. The electronic device as claimed in claim 1, wherein a material of the first reflective element has a reflectivity greater than 85%.

19. The electronic device as claimed in claim 1, wherein the first reflective element has a rounded or curved profile.

* * * * *